United States Patent
Petrov et al.

(10) Patent No.: US 7,340,019 B2
(45) Date of Patent: Mar. 4, 2008

(54) PROGRAMMABLE FILTER

(75) Inventors: Dmitry Petrov, Chandler, AZ (US); Lev Smolyar, Haifa (IL)

(73) Assignee: Intel Corporation, Santa Clara, CA (US)

( * ) Notice: Subject to any disclaimer, the term of this patent is extended or adjusted under 35 U.S.C. 154(b) by 828 days.

(21) Appl. No.: 10/406,768

(22) Filed: Apr. 2, 2003

(65) Prior Publication Data
US 2004/0196934 A1   Oct. 7, 2004

(51) Int. Cl.
H04B 1/10   (2006.01)
(52) U.S. Cl. .......... 375/350; 375/340; 708/5; 708/300; 708/314; 708/819
(58) Field of Classification Search .......... 375/350, 375/343, 340; 382/279, 260–265; 708/5, 708/300, 315, 420, 813, 314, 819
See application file for complete search history.

(56) References Cited

U.S. PATENT DOCUMENTS

| | | | |
|---|---|---|---|
| 4,295,204 A | 10/1981 | Sunstein | |
| 6,219,376 B1* | 4/2001 | Zhodzishsky et al. | 375/148 |
| 6,728,517 B2* | 4/2004 | Sugar et al. | 455/73 |
| 2002/0150174 A1 | 10/2002 | Spiegel et al. | |
| 2002/0198915 A1* | 12/2002 | Rainish | 708/420 |
| 2004/0071244 A1* | 4/2004 | Shaeffer | 375/350 |

FOREIGN PATENT DOCUMENTS

| | | |
|---|---|---|
| GB | 2 123 257 | 1/1984 |
| WO | WO 01/43052 | 6/2001 |
| WO | PCT/US2004/007823 | 8/2004 |

* cited by examiner

*Primary Examiner*—Ted Wang
(74) *Attorney, Agent, or Firm*—Schwabe, Williamson & Wyatt, P.C.

(57) ABSTRACT

Briefly, in accordance with one embodiment of the invention, a programmable filter may implement an infinite impulse response filter so that a transceiver in which the filter is utilized may be programmable to operate in one or more modes in accordance with one or more communication standards. The programmable infinite impulse response filter may replace one or more analog filters of the transceiver so that a desired filter response may be programmed by a baseband processor. Delay functions of an infinite impulse response filter may be implemented using feedback and multiplexing.

28 Claims, 3 Drawing Sheets

PROGRAMMABLE FILTER

BACKGROUND

Radio-frequency systems increasingly are being designed to comply with one or more communications standards. In the past, in order to provide a device that is able to operate in compliance with two or more communications standards, the device was designed to have two or more separate radios and supporting hardware, one for each standard. Although using two or more separate radios and supporting hardware allows a device to be used in more applications than a device that complies with a single standard, having multiple radios and supporting hardware results in a larger and more costly device, and further results in a device having a relatively larger number of integrated circuits. A device that complies with one or more communications standards could take advantage of redundancy in the radios and supporting hardware if some of the circuits in the radios and supporting hardware could be programmable to be tailored to one or more desired communications standards.

DESCRIPTION OF THE DRAWING FIGURES

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
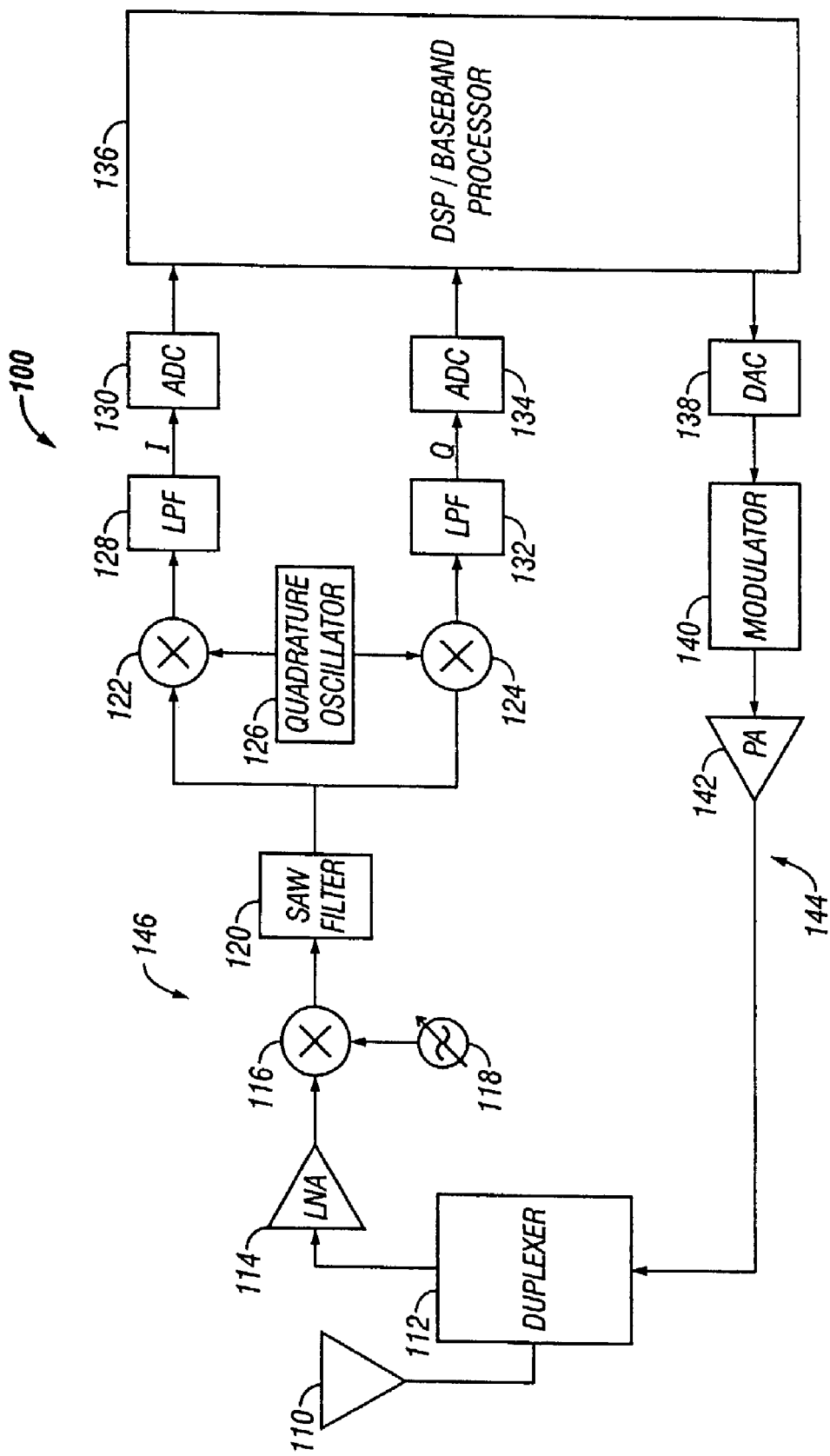
FIG. 1 is a block diagram of a transceiver circuit capable of utilizing a programmable filter in accordance with one embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general-purpose computing device selectively activated or reconfigured by a program stored in the device. Such a program may be stored on a storage medium, such as, but is not limited to, any type of disk including floppy disks, optical disks, CD-ROMs, magnetic-optical disks, read-only memories (ROMs), random access memories (RAM), electrically programmable read-only memories (EPROM), electrically erasable and programmable read only memories (EEPROM), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), wireless local area network (WLAN) communication systems, personal digital assistants (PDAs) and the like.

Types of wireless or cellular radiotelephone communication systems intended to be within the scope of the present invention include, although not limited to, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wideband CDMA (WCDMA), CDMA-2000, wireless local area network (WLAN), wireless wide area network (WWAN), and the like, although the scope of the invention is not limited in this respect.

Referring now to FIG. 1, a block diagram of a transceiver in accordance with on embodiment of the invention will be discussed. Transceiver 100 may be utilized in a communication device such as a portable cellular telephone receiver, for example a GSM, WLAN or a WCDMA device, although the scope of the invention is not limited in this respect. Transceiver 100 may include one or more antennas 110 coupled to a duplexer 112 that combines the transmitter path 144 and receiver path 146 of transceiver 100. Duplexer 112 may include impedance matching circuitry to allow transmitter path 144 and receiver path 146 to share a common antenna or antennas 110. In receiver path 146, duplexer 112 may couple to a low noise amplifier (LNA) 114 to amplify a radio-frequency (RF) signal received at antenna 110, and which in turn may couple to a demodulator 116 and a local oscillator 118 to convert the received RF signal to an intermediate-frequency (IF) signal. Local oscillator 118 may be variable to tune receiver path 146 to a desired carrier frequency of the received RF signal. An IF filter 120 such as a surface acoustic wave (SAW) filter may be used to select the desired intermediate frequency range 120 from the output of mixer 116. The output of IF filter 120 may be passed through a demodulator stage which may include demodulators 122 and 124 coupled to a quadrature oscillator 126 to convert the IF signal into in-phase (I) and quadrature (Q) components or to low intermediate-frequency (LIF) signal. Filters 128 and 132 may be utilized to filter the undesired frequency components from the outputs of demodulators 122 and 124, respectively. The I and Q or LIF signals may be sent through analog-to-digital converters 130 and 134 to be received and processed by a baseband processor 136 which may be a digital signal processor (DSP) or which may include a digital signal processor or a digital signal processor like sub-block as a component thereof, although the scope of the invention is not limited in this respect.

In transmitter path 144, baseband processor 136 may provide a baseband signal to a digital-to-analog converter (DAC) 138 which may in turn provide a signal to be modulated for transmission to modulator 140. The output of the modulator may be passed through a power amplifier (PA) 142 to provide an output signal to duplexer 112 and antenna 110 for radio-frequency transmission, although the scope of the invention is not limited in this respect. In one embodiment of the invention, filters 128 and 132 may be implemented by a programmable filter in accordance with the present invention, for example the programmable filters shown in FIGS. 2 and 3, wherein the filter response of the filters may be controlled by baseband processor 136 in accordance with a desired mode of operation of transceiver 100, although the scope of the invention is not limited in this respect.

Figure 2:
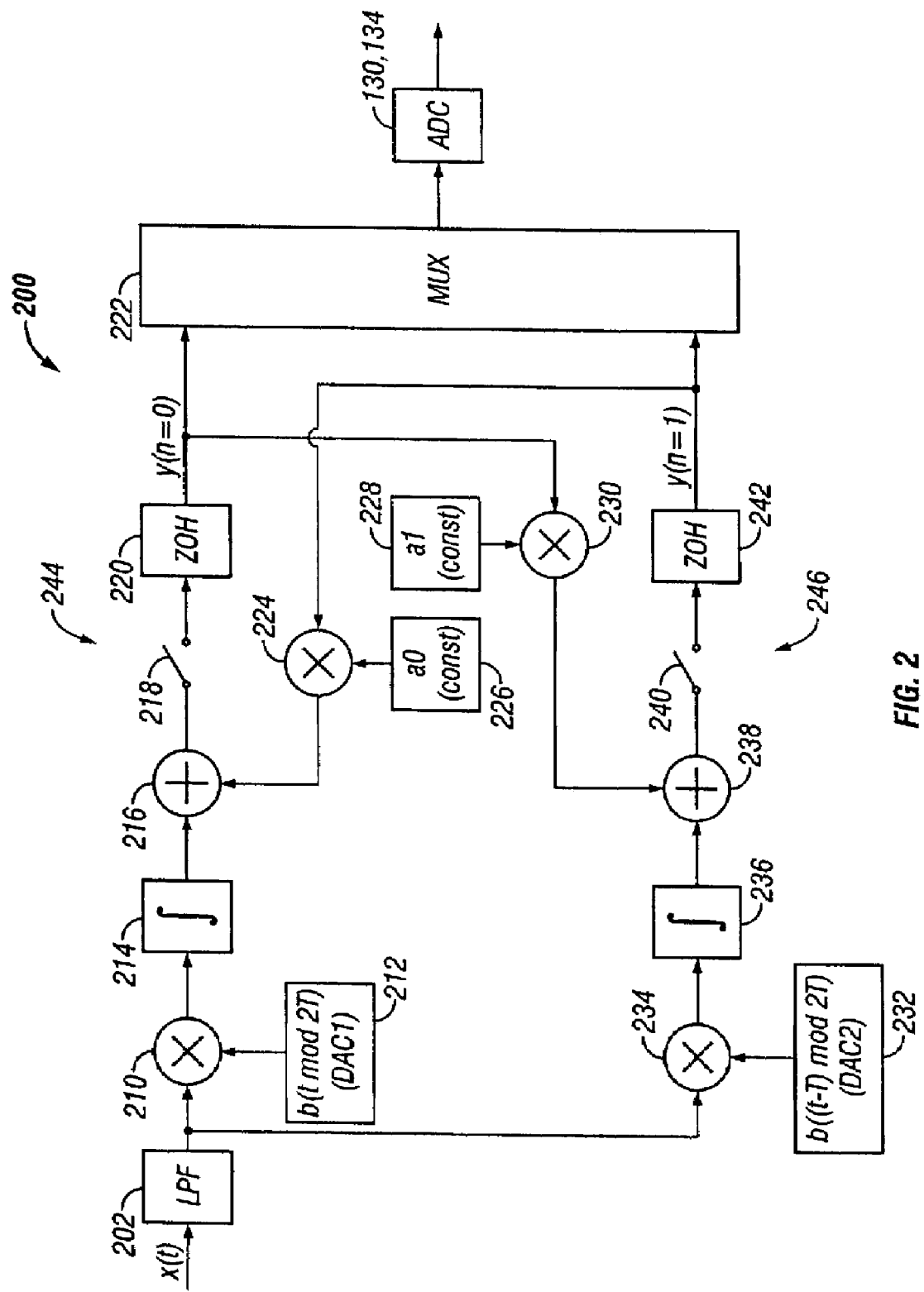
FIG. 2 is a block diagram of a second order programmable filter capable of being utilized in the transceiver of FIG. 1 in accordance with one embodiment of the present invention.

Referring now to FIG. 2, a block diagram of a second order programmable filter in accordance with one embodiment of the invention will be discussed. The filter 200 of FIG. 2 may be utilized in the transceiver 100 as shown in FIG. 1, for example to provide a programmable filter for multi-mode radio capable of operating at more than one frequency or capable of operating in compliance with more than one wireless communication standards, for example GSM, WLAN or WCDMA, although the scope of the invention is not limited in this respect. Filter 200 may be utilized to provide the filtering function of filters 128 and 132 although the scope of the invention is not limited in this respect. Filter 200 may be generally a programmable filter or convolver capable of providing a function of a corresponding analog filter by using integrators and configurable analog multipliers in lieu of analog components as utilized in analog filters. Filter 200 may exhibit an infinite impulse response (IIR) topology that in one embodiment may minimize the number of bits and taps to achieve desired filtering, and that may minimize the amount of components utilized to realize the filter, although the scope of the invention is not limited in this respect.

Filter 200 may receive a time-based signal x(t) at the input of a low pass filter 202 utilized to provide anti-aliasing. The filtered signal may then be multiplied by a multiplier value b(t mod 2T) 212 provided by baseband processor 136 and converted to an analog value using a digital-to-analog converter (DAC). The output multiplier may be integrated with an integrator 214 and summed at summing element 216 with the output of multiplier 224. The output of filter 202 may be multiplied by multiplier value b((t−T)mod 2T) 232 with multiplier 234 where multiplier value is provided by baseband processor 136 via a corresponding DAC, where T is the sampling period, 2T is the impulse response time interval of b(t), and t is the time index. The output of multiplier 234 may be passed through an integrator 236 and summed with the output of multiplier 230 at summing element 238. The outputs of summing elements are sampled with samplers 218 and 240 to provide discrete-time sample signals to zero order hold (ZOH) sample and hold circuits 220 and 242.

The output of zero order hold circuit 220 may be represented as y(n=0) and may be fed into multiplier 230 to be multiplied by a constant value (a1) 228 which may be provided by baseband processor 136. The output of multiplier 230 may be fed to summing element 238. Similarly, the output of zero order hold circuit 242 may be represented as y(n=1) and may be fed into multiplier 224 to be multiplied by a constant value (a0) 226 which may be provided by baseband processor 136. The output of multiplier 224 may be fed to summing element 216. The outputs y(n=0) and y(n=1) may be combined via multiplexer 222 and fed to an analog-to-digital converter (ADC) 130 or 134 and then sent to baseband processor 136.

Each branch 244 and 246 of filter 200 may represent one half of the outputs of a convolution operator for the response of filter 200, and thus the sampling of branches 244 and 246 may represent the filtered signal in a discrete domain which may be forwarded to baseband processor as a sampled analog front end, or alternatively reconstructed to a continuous signal as continuous analog front end, although the scope of the invention is not limited in this respect. As shown in FIG. 2, the delays used in realizing an infinite impulse response (IIR) programmable filter may be achieved by using feedback of signals y(n=0) and y(n=1) and multiplexing via multiplexer 222 rather than using actual delay elements, although the scope of the invention is not limited in this respect. Such an arrangement may reduce the number of DACs to provide multiplier values 212 and 232 to generate the desired filter operation. In a multimode transceiver, filter 200 may be reconfigured, optionally in real-time, in which a baseband processor 136 may reconfigure the response of filter 200 by changing the values provided to filter 200, for example multiplier values 212, 232, 226, and 228, where the reconfiguring may be controlled via user input or via a program running on baseband processor 136, although the scope of the invention is not limited in this respect.

Figure 3:
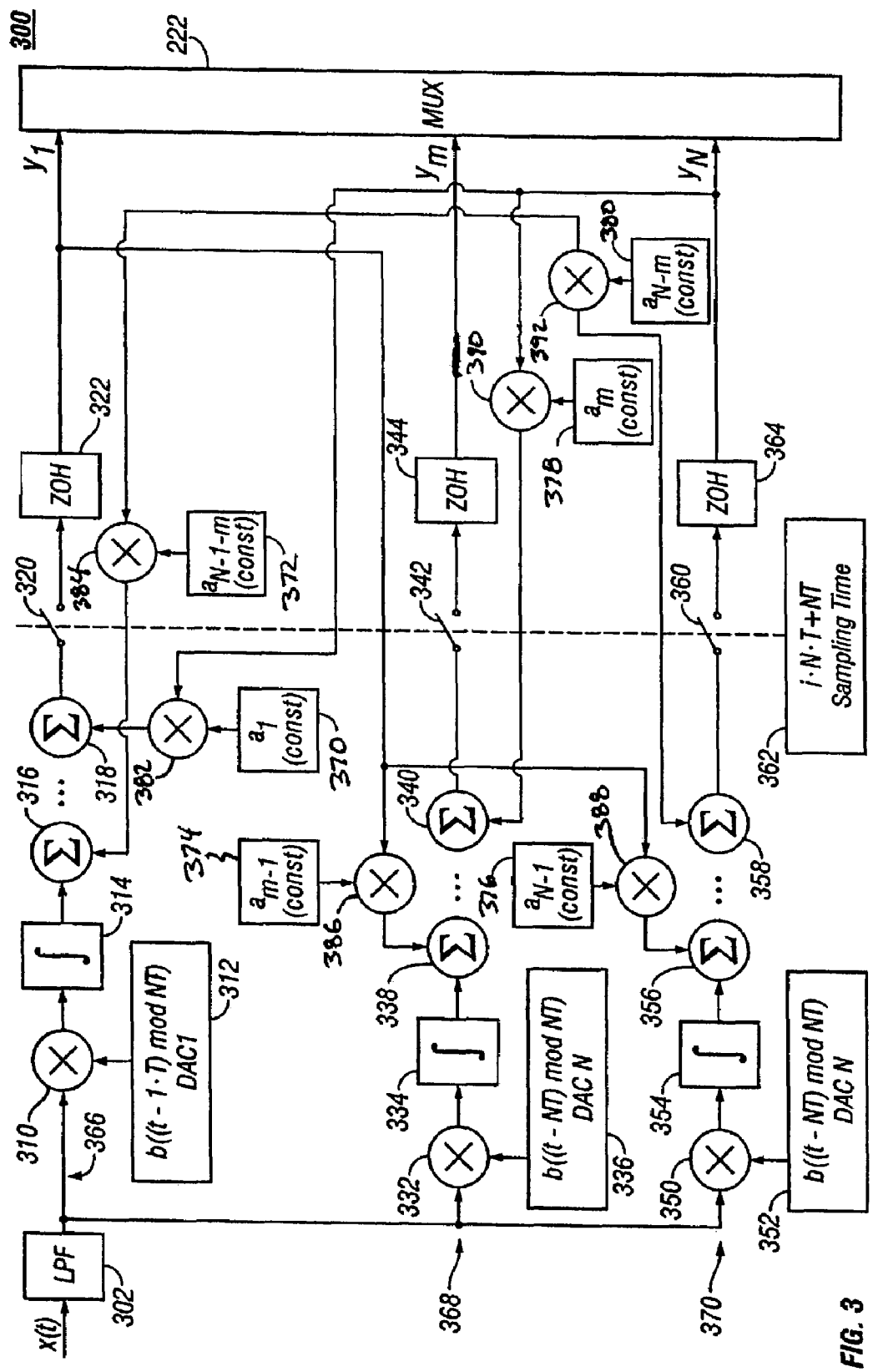
FIG. 3 is a block diagram of a general order programmable filter capable of being utilized in the transceiver of FIG. 1 in accordance with one embodiment of the present invention.

Referring now to FIG. 3, a block diagram of a general order programmable filter in accordance with one embodiment of the invention will be discussed. Filter 300 may be substantially similar to the second order filter 200 of FIG. 2 by representing the general order implementation of filter 200. For an Nth order filter, general order filter 300 may have branches 366, 368, and up to an Nth branch 370 for a total of N branches, although the scope of the invention is not limited in this respect. The continuous time signal x(t) may be passed through a low pass filter 302 for anti-aliasing. The output of filter 302 may be multiplied by the outputs of N DACs, DAC1 312, DAC2 336, up to the Nth DAC 352, to provide values b((t−1·T)mod NT) to b((t−NT)mod NT) consequentially the corresponding multipliers 310, 332, up to the Nth multiplier 350 based on inputs to the DACs received from baseband processor 136. In the equations above, T stands for the sampling rate, mod denotes the modulo mathematical operation, m indicates the number of branches in the Nth order filter 300, and t is running time. The outputs of multipliers 310, 332 and 350 may be integrated by integrators 314, 334, and 354 and fed to summing elements 316, 338, and 356, the outputs of which may be combined with up to N summing elements to the Nth summing element 318, 340, and 358 in the branches. The outputs of summing elements 318, 340, and 358 may be sampled via samplers 320, 342, up to the Nth sampler 360, at sampling time calculated for each branch by formula i·N·T+m·T, where i is the running index from 1 . . . ∞ and index m corresponds to the branch number. Branches may be sampled at time instances separated by the time T, where T is the sampling interval. The sampled signals may be passed to zero order hold sample and hold circuits 322, 344, up to the Nth zero order hold circuit 364 that holds the sampled signal for the time N*T, although the scope of the invention is not limited in this respect. The N branches of filter 300 may provide discrete domain outputs y(n=1), y(n=m), up to the Nth output y(n=N) to multiplexer 222 which may provide an output to analog to digital converters 130 and 134, which may in turn provide outputs to baseband processor 136, although the scope of the invention is not limited in this respect. The N discrete time outputs are fed back to various summing elements as shown in FIG. 3, multiplied with constant values 370, 372, 374, 376, 378, and 380, and multiplied via multipliers 382, 384, 386, 388, 390, and 392, although the scope of the invention is not limited in this respect.

Although the invention has been described with a certain degree of particularity, it should be recognized that elements thereof may be altered by persons skilled in the art without departing from the spirit and scope of the invention. It is believed that the programmable filter or the like of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising:
at least two convolver branches, wherein a first branch of the at least two convolver branches includes a first multiplier to multiply an input signal with a first multiplication value, a first filter to filter an output of the first multiplier, and a first sample and hold circuit to receive the output of the first filter to provide a first sampled output, and a second branch of the at least two convolver branches includes a second multiplier to multiply the input signal with a second multiplication value, a second filter to filter an output of the second multiplier, and a second sample and hold circuit to receive the output of the second filter to provide a second sampled output; and
a multiplexer to combine the first and second sampled outputs; wherein the first sampled output is added to an input of the second sample and hold circuit and the second sampled output is added to an input of the first sample and hold circuit.

2. The apparatus as claimed in claim 1, wherein the first and second multiplication values are provided by a baseband processor to provide a desired filter response.

3. The apparatus as claimed in claim 1, wherein the first and second sampled outputs added to the inputs of the respective second and first sample and hold circuits are multiplied by first and second constant values, respectively.

4. The apparatus as claimed in claim 3, wherein the first and second constant values are provided by a baseband processor.

5. The apparatus as claimed in claim 1, wherein the first and second multiplication values are provided by a baseband processor to provide a programmable filter response according to a desired mode of operation.

6. The apparatus as claimed in claim 1, said at least two convolver branches comprising N convolver branches, wherein N is an integer, wherein each of said N convolver branches includes a sampled output fed back to an input of a sample and hold circuit of another one of the said N convolver branches.

7. The apparatus as claimed in claim 1, wherein the first and second filters comprise first and second integrators, respectively.

8. A method, comprising:
multiplying an input signal through a first convolver branche by a first multiplication value and a second convolver branch by a second multiplication value;
integrating the input signal multiplied through the first convolver branch to provide a first integrated signal and the input signal multiplied through the second convolver branch to provide a second integrated signal;
sampling the first and second integrated signals in the first and second convolver branches, respectively, to provide first and second sampled outputs, respectively;

adding the first sampled output to the second integrated signal in the second convolver branch;

adding the second sampled output to the first integrated signal in the first convolver branch; and combining the first and second sampled outputs.

9. The method as claimed in claim 8, further comprising selecting the first and second multiplication values to provide a desired filter response.

10. The method as claimed in claim 8, further comprising multiplying the first and second sampled outputs by first and second constant values, respectively.

11. The method as claimed in claim 8, further comprising multiplying the first and second sample outputs by first and second constant values to provide a desired filter response.

12. The method as claimed in claim 8, wherein said combining includes multiplexing the first and second sampled outputs.

13. The method as claimed in claim 8, further comprising selecting the first and second multiplication values according to a filter mode.

14. The method as claimed in claim 8, said multiplying including multiplying the input signal through N convolver branches, including the first and second convolver branches, wherein N is an integer, and said adding including adding a sampled output of each of the N convolver branches to an integrated signal of another one of said N convolver branches.

15. An article comprising a computer readable storage medium having computer executable instructions stored thereon that, when executed, result in a filter response provided by:

multiplying an input signal through a first convolver branch by a first multiplication value and a second convolver branch by a second multiplication value;

integrating the input signal multiplied through the first convolver branch to provide a first integrated signal and the input signal multiplied through the second convolver branch to provide a second integrated signal;

sampling the first and second integrated signals in the first and second convolver branches, respectively, to provide first and second sampled outputs, respectively;

adding the first sampled output to the second integrated signal in the second convolver branch;

adding the second sampled output to the first integrated signal in the first convolver branch; and combining the first and second sampled outputs.

16. The article as claimed in claim 15, wherein the instructions further result in selecting the first and second multiplication values to provide a desired filter response.

17. The article as claimed in claim 15, wherein the instructions further result in multiplying the first and second sampled outputs by first and second constant values, respectively.

18. The article as claimed in claim 15, wherein the instructions further result in multiplying the first and second sample outputs by first and second constant values, respectively, to provide a desired filter response.

19. The article as claimed in claim 15, wherein the instructions further result in said combining to include multiplexing the first and second sampled outputs.

20. The article as claimed in claim 15, wherein the instructions further result in selecting the first and second multiplication values according to a filter mode.

21. The article as claimed in claim 15, wherein the instructions further result in said multiplying to include multiplying the input signal through N convolver branches, including the first and second convolver branches, wherein N is an integer, and said adding to include adding a sampled output of each of the N convolver branches to an integrated signal of another one of said N convolver branches.

22. An apparatus, comprising:

a baseband processor;

a transceiver to couple to said baseband processor;

a microstrip antenna to couple to said transceiver; and said transceiver including a programmable filter, said filter comprising:

at least two convolver branches, wherein a first branch of the at least two convolver branches includes a first multiplier to multiply an input signal with a first multiplication value, a first filter to filter an output of the first multiplier, and a first sample and hold circuit to receive the output of the first filter to provide a first sampled output, and a second branch of the at least two convolver branches includes a second multiplier to multiply the input signal with a second multiplication value, a second filter to filter an output of the second multiplier, and a second sample and hold circuit to receive the output of the second filter to provide a second sampled output; and a multiplexer to combine the first and second sampled outputs; wherein the first sampled output is fed back to an input of the second sample and hold circuit and the second sampled output is fed back to an input of the first sample and hold circuit.

23. The apparatus as claimed in claim 22, wherein the first and second multiplication values are provided by the baseband processor to provide a desired filter response of said filter.

24. The apparatus as claimed in claim 22, wherein the first and second sampled outputs fed back to the second and first sample and hold circuits, respectively, are multiplied by first and second constant values, respectively.

25. The apparatus as claimed in claim 24, wherein the first and second constant values are provided by the baseband processor.

26. The apparatus as claimed in claim 22, wherein the first and second multiplication values are provided by the baseband processor to provide a programmable filter of the filter response according to a desired mode of operation.

27. The apparatus as claimed in claim 22, said at least two convolver branches comprising N convolver branches, wherein N is an integer, wherein each of said N convolver branches includes a sampled output added to an input of a sample and hold circuit of another one of said N convolver branches.

28. The apparatus as claimed in claim 22, wherein the filter comprises an integrator.

* * * * *